(12) United States Patent
Shimura

(10) Patent No.: US 7,824,496 B2
(45) Date of Patent: Nov. 2, 2010

(54) CONTAINER, CONTAINER PRODUCING METHOD, SUBSTRATE PROCESSING DEVICE, AND SEMICONDUCTOR DEVICE PRODUCING METHOD

(75) Inventor: Kazuhiro Shimura, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1157 days.

(21) Appl. No.: 10/548,877

(22) PCT Filed: Mar. 4, 2004

(86) PCT No.: PCT/JP2004/002731

§ 371 (c)(1),
(2), (4) Date: Jun. 16, 2006

(87) PCT Pub. No.: WO2004/086474

PCT Pub. Date: Oct. 7, 2004

(65) Prior Publication Data

US 2007/0170088 A1  Jul. 26, 2007

(30) Foreign Application Priority Data

Mar. 25, 2003 (JP) .............................. 2003-083179

(51) Int. Cl.
B65D 85/00 (2006.01)
B65D 81/28 (2006.01)
C23C 14/00 (2006.01)
C23C 16/00 (2006.01)

(52) U.S. Cl. ...................... 118/719; 206/832; 277/590; 277/595

(58) Field of Classification Search .................. 206/832; 277/590, 595

See application file for complete search history.

(56) References Cited

U.S. PATENT DOCUMENTS 4,929,408 A * 5/1990 Lodder et al. ................ 264/149

(Continued)

FOREIGN PATENT DOCUMENTS

JP 9-297192 11/1997
JP 2003-139887 5/2003

OTHER PUBLICATIONS

Office Action dated Jul. 1, 2008 corresponding to Japanese Patent Application No. 2005-503988.

*Primary Examiner*—Michael Cleveland
*Assistant Examiner*—Nathan K Ford
(74) *Attorney, Agent, or Firm*—Kratz, Quintos & Hanson, LLP

(57) ABSTRACT

A pressure resistant case (22) is constructed in a rectangular parallelepiped box shape by assembling a bottom plate (61) and ceiling plate (62) and first side plate (63) and second side plate (64) and third side plate (65) and a fourth side plate (66) formed of thick aluminum plate and by welding on four sides by the TIG welding method. In the TIG welding of the ceiling plate (62) and the first side plate (63), the end surface on the side where a hollow section (72) of the ceiling plate (62) is formed, abuts against the main surface on the side where the locating section (71) of the first side plate (63) is formed. The edge near the hollow section (72) of the ceiling plate (62) is abutted against the locating section (71), and a fillet weld section (75) is formed by TIG welding on the corner section formed by the ceiling plate (62) and the locating section (71). The heat capacity of the hollow section of the ceiling plate and the locating section for TIG welding is small so that the fillet weld section can be formed even in aluminum plate possessing a high thermal conductivity. The vacuum performance, etc. of the pressure resistant case can be maintained since the slit formed between the contact surfaces is blocked by the fillet weld section.

11 Claims, 7 Drawing Sheets

U.S. PATENT DOCUMENTS 4,962,726 A * 10/1990 Matsushita et al. .......... 118/719

6,142,773 A * 11/2000 Shimazu ..................... 432/241

* cited by examiner

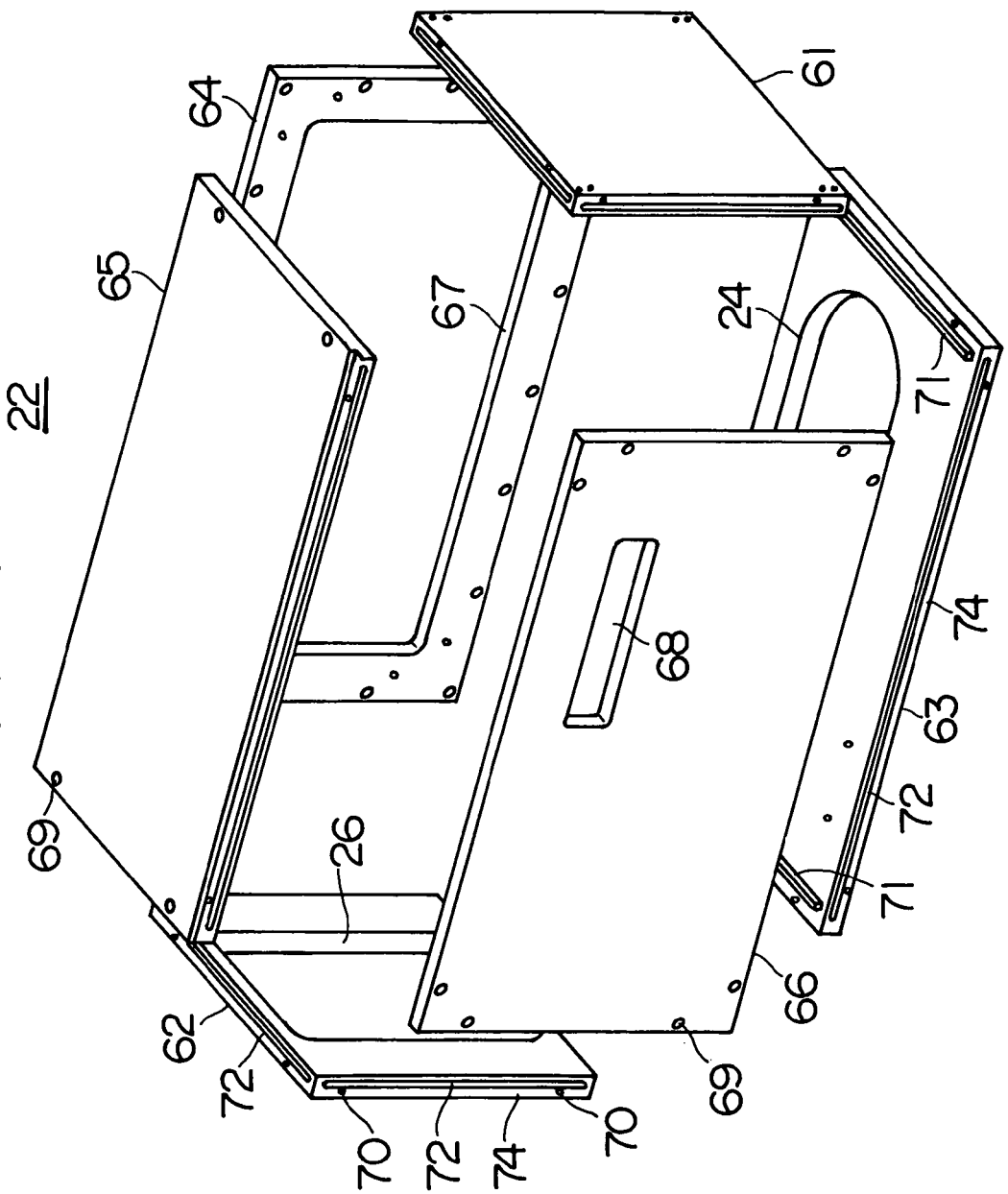

CONTAINER, CONTAINER PRODUCING METHOD, SUBSTRATE PROCESSING DEVICE, AND SEMICONDUCTOR DEVICE PRODUCING METHOD

TECHNICAL FIELD

The present invention relates to a substrate processing device and relates in particular to a vacuum container for forming a standby chamber adjacent to a processing chamber and effective for example in film forming processes that form a CVD film on a semiconductor wafer (hereafter called a "wafer") for making the IC in methods for manufacturing semiconductor integrated circuit devices (hereafter called an "IC").

BACKGROUND ART

In the process for forming a film by depositing silicon nitride ($Si_3N_4$), silicon oxide (SiOx) or polysilicon, etc. on a wafer in the method for manufacturing ICs, the batch type vertical hot wall low pressure CVD device is widely utilized and comprises a process tube including a processing chamber for forming film on multiple wafers while held in a boat; and a standby chamber formed directly below the process tube for allowing the boat to await loading into or unloading from the processing chamber; and a boat elevator for raising or lowering the boat for loading into or unloading from the processing chamber.

A CVD device of this type in the prior art is a batch type vertical hot wall low pressure CVD device (hereafter called a load-lock CVD device) of the load-lock system in which the standby chamber is formed by a vacuum container (referred to as a load-lock chamber) for withstanding a pressure below atmospheric pressure (for example, see Japanese patent No. 3239977).

The load-lock system separates the processing chamber and the loading/unloading chamber by using a separation valve such as a gate valve to prevent air from flowing into the processing chamber, and minimizing external disturbances from temperature and pressure to stabilize the process.

The load-lock chamber (vacuum container) forming the standby chamber in the load-lock CVD device is built from stainless steel or cast iron for structure possessing large mechanical strength to withstand a pressure below atmospheric pressure and so the load-lock chamber has the problem of a large weight.

Constructing the load-lock chamber in load-lock CVD devices from aluminum for a light weight and corrosion resistance is considered. However, the thermal conductivity of the aluminum (236 W/m·K at 0° C., 240 W/m·K at 100° C.) is large compared to the thermal conductivity of stainless steel (16.3 W/m·K at 0° C. to 100° C.). This method therefore possesses the problem that vacuum seal welding on material with a plate thickness of 20 millimeters or more is extremely difficult with the TIG (tungsten inert gas) welding method and MIG (metal inert gas) welding method.

Methods to construct a vacuum container of aluminum without welding include a manufacturing method for cutting out the container from a clump of aluminum or the aluminum diecast method. However, along with limits on the depth of the cutting direction and the size of the metal mold, when the cutting depth and size of the metal mold become too large, the material costs become excessive so utilizing these methods is not practical for manufacturing large capacity vacuum containers.

The present invention therefore has the object of providing a light-weight and low cost container that can be manufactured by welding, as well as a manufacturing method for a substrate processing device utilizing that container and a method for manufacturing semiconductor devices.

DISCLOSURE OF INVENTION

The container of the present invention is characterized by comprising a joining section between a first base material and a second base material, wherein a weld section, a hollow section, and a contact section are arranged in sequence in the joining section, and the thickness of the weld section is set thinner than the thickness of the contact section.

In the present invention, by making the weld section thinner than the contact section, the heat capacity of the weld section is reduced so that even members with a large thermal conductivity such as aluminum can be welded.

BRIEF DESCRIPTION OF DRAWINGS

FIG. 4 is an exploded perspective view showing the pressure resistant case of one embodiment of the present invention;

FIG. 5A is an exploded perspective view showing the entire base material; FIG. 5B is a cross sectional view showing the state prior to welding; FIG. 5C is a cross sectional view showing the state after welding;

FIG. 6A is a cross sectional view showing the state prior to welding; FIG. 6B is a cross sectional view showing the state after welding;

BEST MODE FOR CARRYING OUT THE INVENTION

One embodiment of the present invention is hereinafter described while referring to the accompanying drawings.

The substrate processing device of this invention is in this embodiment comprised of a load-lock type CVD device (load-lock type batch type vertical hot wall low pressure CVD device) utilized in the film forming processes for forming CVD film on wafers for manufacturing ICs. The container of this invention forms a load-lock chamber for a standby chamber.

Figure 1:
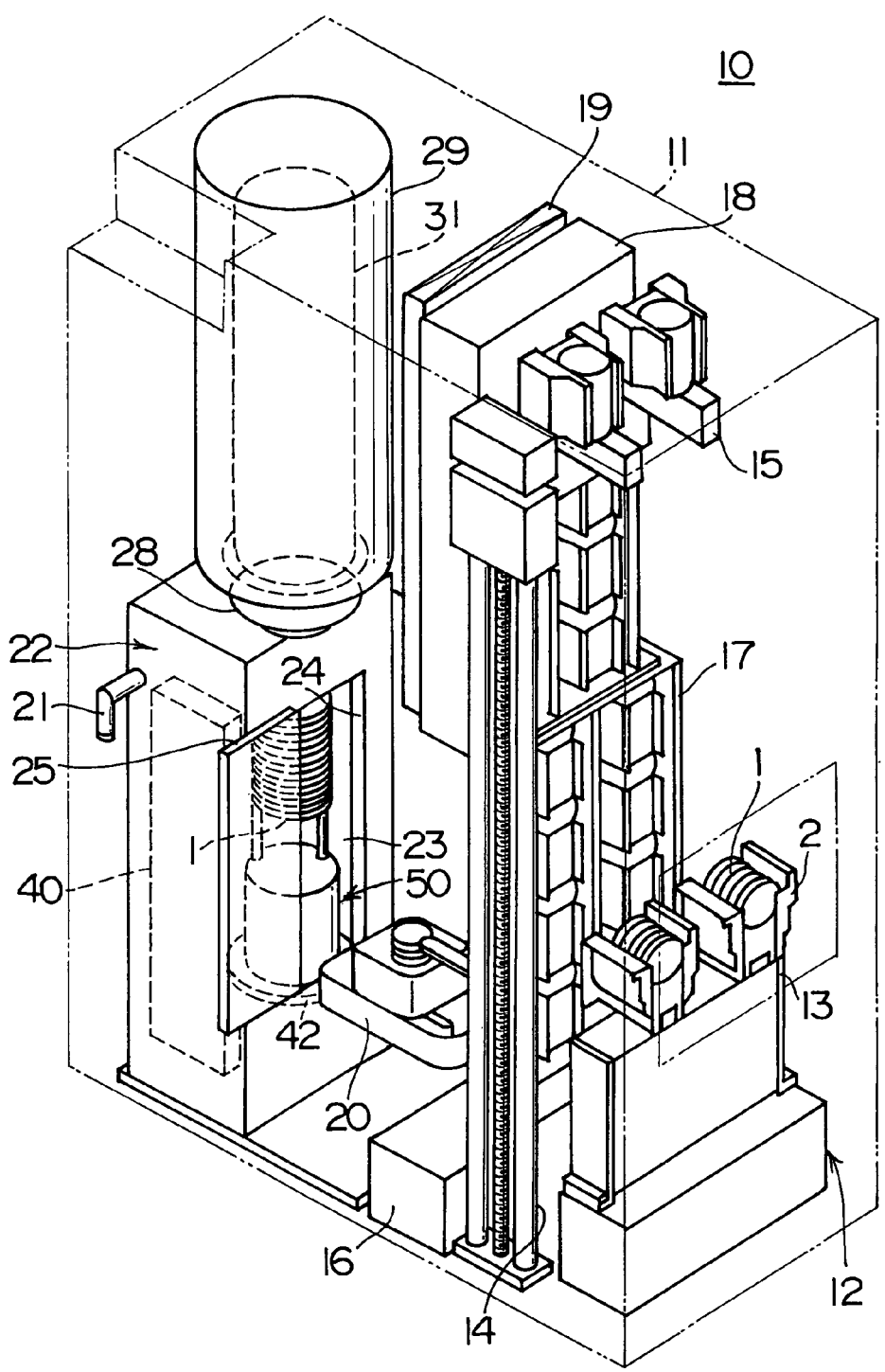
FIG. 1 is a perspective view with one section omitted showing the entire load-lock CVD device of one embodiment of the present invention.

A load-lock CVD device 10 as shown in FIG. 1, includes a case 11, and a cassette transfer unit 12 is installed on the front of the case 11. The cassette transfer unit 12 contains a cassette stage 13 capable of loading two cassettes 2 that serve as carriers for wafers 1. When the cassette 2 transported by an external feed mechanism (not shown in drawing) is mounted upright (state where the wafers 1 stored in the cassette 2 are vertical) in the cassette stage 13, the cassette stage 13 is rotated 90 degrees to change the cassette 2 to a horizontal state. A cassette elevator 14 is installed on the rear side of the cassette stage 13. The cassette elevator 14 is structured to raise and lower a cassette transfer equipment 15. A cassette rack 17 shifted laterally by a slide stage 16 is installed on the rear side of the cassette elevator 14, and a buffer cassette rack 18 is installed above the cassette rack 17. A clean unit 19 for allowing passage of clean air to the interior of the case 11 is installed on the rear side of the buffer cassette rack 18. A wafer transfer equipment 20 capable of transporting a batch of multiple wafers 1 or transporting one wafer and also capable of rotating and rising and lowering is installed on the rear side of the cassette rack 17.

Figure 2:
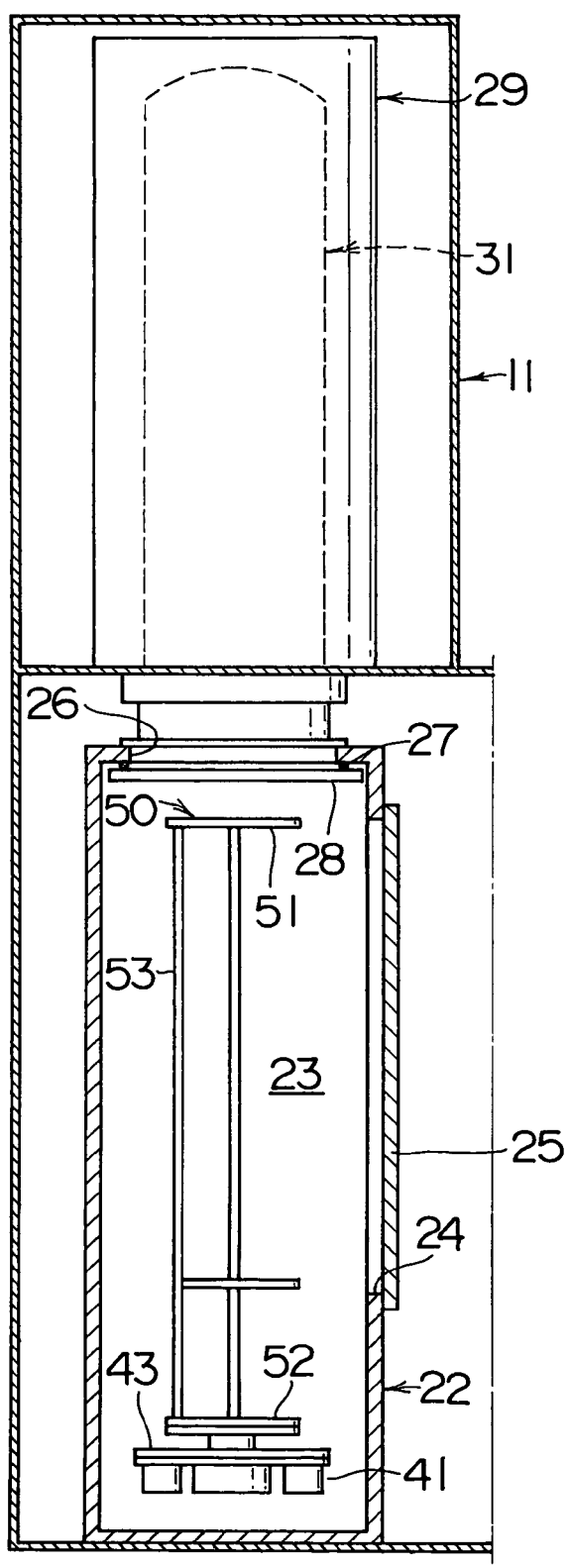
FIG. 2 is a side cross sectional view showing an essential section of that device.

A load-lock chamber (hereafter called "pressure resistant case") 22 containing an exhaust pipe 21 for evacuating to the pressure below atmospheric pressure is installed on the lower section on a rear end section of the case 11. The pressure resistant case 22 forms a standby chamber 23 for containing the boat in a standby state. As described later on, the pressure resistant case 22 is comprised of a vacuum container with multiple aluminum plates affixed by the TIG welding method into a right-angled parallelepiped box shape. A wafer loading/unloading opening 24 is provided on the front wall of the pressure resistant case 22. The wafer loading/unloading opening 24 is opened and closed by a load-lock door 25. As shown in FIG. 2, a boat loading/unloading opening 26 is provided on the ceiling wall of the pressure resistant case 22. A seal ring 27 is installed on the lower surface of the ceiling wall of the pressure resistant case 22 so as to enclose the boat loading/unloading opening 26. The boat loading/unloading opening 26 is opened and closed by a shutter 28. A heater unit 29 is installed facing perpendicularly on the pressure resistant case 22. A process tube 31 is installed concentrically in the interior of the heater unit 29.

Figure 3:
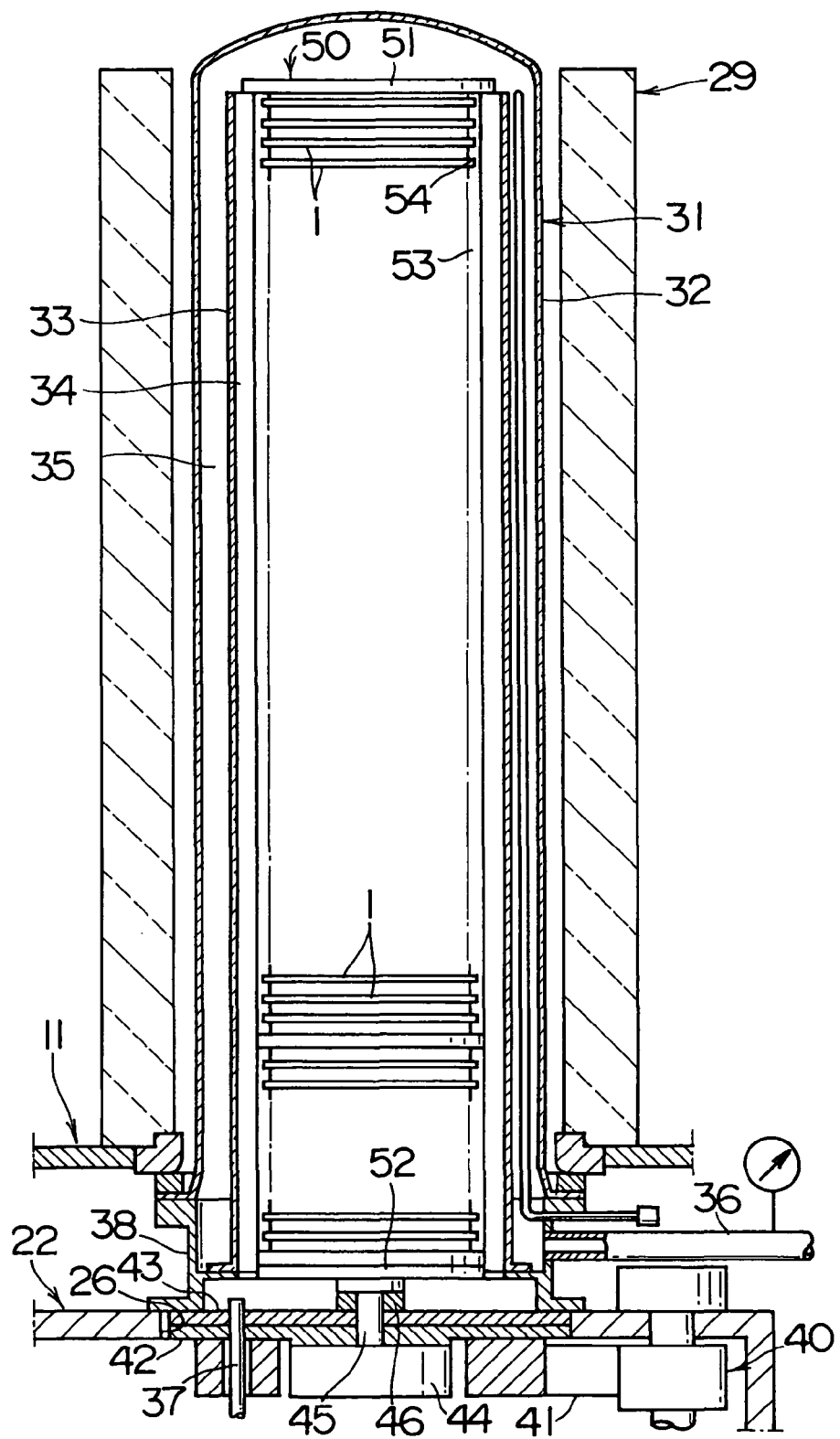
FIG. 3 is a rear cross sectional view showing the essential section during boat loading.

As shown in FIG. 3, the process tube 31 contains an outer tube 32 and an inner tube 33 installed concentrically. The outer tube 32 of quartz glass or silicon carbide (SiC) is a single cylindrical shape sealed on the top end and open on the bottom end. The inner tube 33 of quartz glass or silicon carbide is formed in a cylindrical shape open on both the top and bottom ends. A processing chamber 34 is formed by the hollow section of the inner tube 33. The processing chamber 34 is structured to allow loading of the array of multiple wafers supported concentrically by the boat. The bottom end opening of the inner tube 33 has an opening diameter larger than the maximum diameter of the wafers which are substrates to be processed. A ring-shaped exhaust path 35 is formed by the gap between the outer tube 32 and inner tube 33.

As shown in FIG. 3, a manifold 38 is installed concentrically with the outer tube 32 in the bottom end of the outer tube 32. The manifold 38 is made of stainless steel and is formed in a small cylindrical shape open on both the top and bottom ends. The outer tube 32 is maintained in a perpendicular state by the manifold 38 supported by the pressure resistant case 22. One end of a large-diameter exhaust pipe 36 connected to the vacuum exhaust device (not shown in drawing) at the other end is connected to the upper section of the side wall of the manifold 38. The exhaust pipe 36 is structured to evacuate the exhaust path 35 formed by the gap between the outer tube 32 and the inner tube 33. A gas feed pipe 37 is inserted to connect to the space on the lower side of the processing chamber 34 of the inner tube 33, and the other end of the gas feed pipe 37 is connected to a gas supply device (not shown in drawing) for supplying gas such as material gas or nitrogen gas.

As shown in FIG. 3, a base 42 is supported for rising and lowering perpendicularly by an arm 41 of the boat elevator 40 installed in the standby chamber 23. A seal cap 43 is mounted in parallel with a slight gap on the base 42 and is supported horizontally. The seal cap 43 is formed in a disk shape approximately equivalent to the outer diameter of the manifold 38, and contacts the bottom end surface of the manifold 38 to seal the furnace opening. A rotating shaft 45 rotated by means of a boat rotating drive motor 44 is supported perpendicularly along the center line of the base 42 for free rotational movement by a bearing device 46. A boat 50 on the top end of the rotating shaft 45 is clamped in an upright, perpendicular state.

The boat 50 includes a pair of end plates 51 and 52 for the top and bottom and multiple support members 53 installed perpendicularly between the end plates 51 and 52. Multiple support grooves 54 are provided longitudinally at equal spaces on each support member 53 and respectively formed with an opening in the same flat surface. By inserting the external circumferential side of the wafer 1 on the multiple support grooves 54, the wafers are held arrayed horizontally in the boat 50.

The film forming process in the method for manufacturing semiconductor devices of an embodiment of the present invention using the load-lock CVD device structured as related above is described next.

The cassette 2 storing multiple wafers 1 is supplied by the external feed mechanism to the cassette stage 13 of the cassette transfer unit 12. The supplied cassette 2 is in a horizontal state due to 90 degree rotation by the cassette stage 13. The horizontal cassette 2 is transferred to the cassette rack 17 or the buffer cassette rack 18 by the cassette transfer equipment 15.

The wafers 1 for film forming that are stored in the cassette 2, are loaded to the standby chamber 23 by the wafer transfer equipment 20 via the wafer loading/unloading opening 24 of the pressure resistant case 22, and charged into the boat 50. The inflow of a high temperature atmosphere of the processing chamber 34 to the standby chamber 23 is prevented at this time by the closing of the boat loading/unloading opening 26 by the shutter 28 as shown in FIG. 2. The wafers 1 being charged and the already charged wafers 1 are not exposed to the high temperature atmosphere so that adverse effects such as from natural oxidation due to the wafers 1 being exposed to high temperature atmosphere are prevented.

When the pre-specified number of wafers 1 are charged into the boat 50, the wafer loading/unloading opening 24 is sealed by the load-lock door 25, and the standby chamber 23 is set to the specified vacuum intensity (for example, 200 Pa). Drawing the vacuum removes the oxygen and moisture from the standby chamber 23. The standby chamber 23 is formed by the pressure resistant case 22 so no deformation occurs even if decompressed below atmospheric pressure. The inert gas such as nitrogen gas is next supplied to the standby chamber 23, and the standby chamber 23 returns to atmospheric pressure (approximately 100,000 Pa) by being purged by the inert gas. The shutter 28 then opens the boat loading/unloading opening 26 to prevent outer turbulence from penetrating into the processing chamber 34.

The boat 50 supported by way of the seal cap 43 in the arm 41 of the boat elevator 40 is then loaded from the boat loading/unloading opening 26 into the processing chamber 34 of the process tube 31. When the boat 50 rises to the upper limit as shown in FIG. 3, the periphery of the upper surface of the seal cap 43 shuts the boat loading/unloading opening 26 into a sealed state so that the processing chamber 34 of the process tube 31 is shut air-tight.

The processing chamber 34 of the process tube 31 is evacuated to reach a specified pressure by the exhaust pipe 36, while the processing chamber 34 of the process tube 31 is closed in a sealed state. The processing chamber 34 is then heated to a specified temperature by the heater unit 29, and the specified material gas is supplied by way of the gas feed pipe 37 at a specified flow rate. The heat treatment of the wafers 1 is in this way performed according to the pre-established processing conditions. The material gas makes uniform contact with the surface of the wafers 1 at this time due to rotation of the boat 50 by the boat rotation drive motor 44, so that the CVD film is uniformly applied to the wafers 1.

When the pre-established processing time elapses, the boat 50 supported by way of the seal cap 43 in the arm 41 of the boat elevator 40 is then unloaded from the processing chamber 34 of the process tube 31, after purging of the standby chamber 23 with nitrogen gas.

When the boat 50 is unloaded from the processing chamber 34 to the standby chamber 23, the boat loading/unloading opening 26 is sealed by the shutter 28, and the load-lock door 25 opens the wafer loading/unloading opening 24 of the standby chamber 23. The now processed wafers 1 on the boat 50 are stored in the empty cassette 2 along with being discharged by the wafer transfer equipment 20. The cassette 2 storing the specified number of transfer processed wafers 1 is transported to the cassette transfer unit 12 by the cassette transfer equipment 15.

By repeating the above described functions, the wafers 1 can be batch processed for example, in batches of 25 wafers, 50 wafers, 75 wafers, 100 wafers, or 150 wafers each in the load-lock CVD device 10.

The welding method and the structure of the pressure resistant case 22 that is the container as the characteristics of the present invention are described in detail next while referring to FIG. 4 and later.

As shown in FIG. 4, the pressure resistant case 22 is comprised of a bottom plate 61, a ceiling plate 62, a first side plate 63, a second side plate 64, a third side plate 65 and a fourth side plate 66. These plates are welded by the TIG method in a state where the four sides of these plates are joined together in a right-angled parallelepiped box structure. The bottom plate 61, the ceiling plate 62, the first side plate 63, the second side plate 64, the third side plate 65 and the fourth side plate 66 are all made of aluminum and formed in flat plates with a thickness of 20 millimeters or more. The bottom plate 61 and the ceiling plate 62 are respectively formed in approximately square shapes with mutually equivalent outer contours. The boat loading/unloading opening 26 is formed on the ceiling plate 62. The first side plate 63, second side plate 64, third side plate 65 and fourth side plate 66 are respectively formed in approximately rectangular shapes with mutually equivalent outer contours. The wafer loading/unloading opening 24 is formed in the first side plate 63. A maintenance inspection opening 67 of large dimensions is formed on the second side plate 64. This maintenance inspection opening 67 is usually sealed with a door (not shown in drawing). An installation hole 68 for use during installation of the exhaust pipes, etc. is formed in the fourth side plate 66. Each of insertion bolt holes 69 and each of female screw holes 70 are respectively formed in the bottom plate 61, ceiling plate 62, first side plate 63, second side plate 64, third side plate 65 and the fourth side plate 66 for securing them temporarily.

The same TIG welding method is mutually used for the bottom plate 61, ceiling plate 62, first side plate 63, second side plate 64, third side plate 65 and the fourth side plate 66, so one example is described using the welding location between the ceiling plate 62 and the first side plate 63.

Figure 5A:
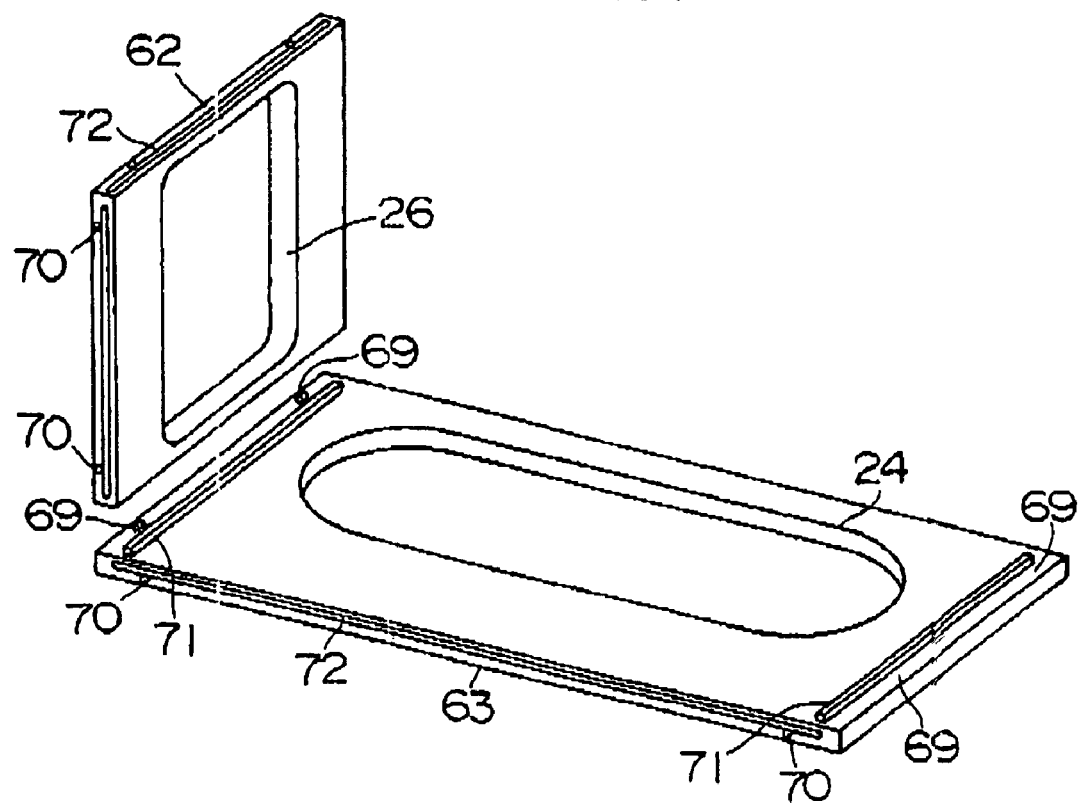
FIGS. 5A, 5B and 5C are drawings showing the welding method for the pressure resistant case.

As shown in FIG. 5, a locating section 71 formed in a narrow square-shaped rod is provided in parallel with one end, near the short one end of the main surface on the side where the ceiling plate 62 is welded in the first side plate 63 serving as the first base material. A narrow groove-shaped hollow section 72 closed on both ends and with a rectangular shaped section is formed in parallel with the main surface at a position near the main surface on the inner side, on the end surface of the ceiling plate 62 serving as the second base material to be joined up against the first side plate 63. A leak check hole 73 for connecting the hollow section 72 to the outside, is formed at a position facing one end of the hollow section 72 of the ceiling plate 62. Both the thickness b of the first side plate 63 and the thickness b of the ceiling plate 62 are set at a thickness of 20 millimeters or more in order to withstand the specified vacuum level below atmospheric pressure. The thickness a from the hollow section 72 to the contact surface with the locating section 71 and the thickness a of the locating section 71 are set to approximately 7 millimeters. In other words, the thickness a of the locating section 71 is set thinner than the thickness of the contact section 74 with the first side plate 63 in the ceiling plate 62. The depth c of the groove of the hollow section 72 is set to approximately 15 millimeters.

Figure 5B:
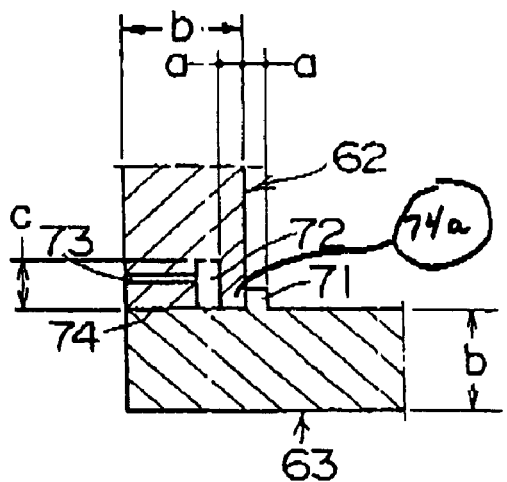

As shown in FIG. 5B, in the TIG welding of the ceiling plate 62 and the first side plate 63, the contact section 74 on the side where the hollow section 72 of the ceiling plate 62 is provided is in contact with the main surface on the side where the locating section 71 of the first side plate 63 is provided. Moreover, the edge portion (74a) near the hollow section 72 of the ceiling plate 62 is pressed against the locating section 71. In this state, the ceiling plate 62 and the first side plate 63 are temporarily fastened by a bolt (not shown in drawing) inserted into the bolt insertion hole 69 and screwed into the female screw hole 70. This temporary fastening method is not limited to screw stop method by the bolt insertion hole 69 and bolt, and other temporary fastening methods may be used such as spot welding and in some cases the temporary fastening may be omitted.

Figure 5C:
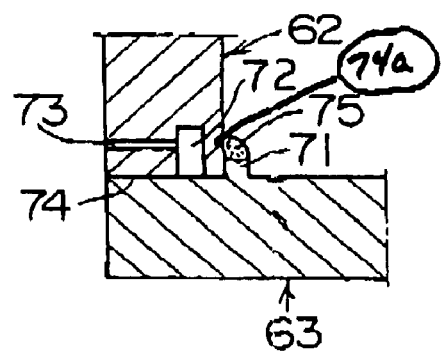

As next shown in FIG. 5C, a fillet weld section 75 is formed by the TIG welding method on the corner formed by the upper side section of the edge near the hollow section 72 of the ceiling plate 62 and the upper surface of the locating section 71 of the first side plate 63. The ceiling plate 62 and the first side plate 63 for this TIG welding are formed of aluminum plate that is 20 millimeters or more in thickness. However, the section near the hollow section 72 of the ceiling plate 62 and the locating section 71 of the first side plate 63 in which the fillet weld section 75 is formed are both formed to a thickness a of approximately 7 millimeters. Therefore, because of the small heat capacity of the section heated by the heat from the arc in the TIG welding method, the suitable fillet weld section 75 can be made even in the ceiling plate 62 and the first side plate 63 made of aluminum possessing a large thermal conductivity. Not only is the fillet weld section 75 formed in a state where the slit between the contact surfaces of the edge of the ceiling plate 62 and the locating section 71 of the first side plate 63 is blocked, but also the bead surface is formed to be comparatively smooth so that leakage is securely prevented. In other words, the fillet weld section 75 maintains the vacuum functions of the pressure resistant case 22 and also functions to securely prevent impurities and particles from occurring.

The pressure resistant case forming the standby chamber in the load-lock CVD device is generally constructed using cast iron for structure or stainless steel possessing large mechanical strength to withstand pressure below atmospheric pressure. The weight of the pressure resistant case constructed using cast iron for structure or stainless steel in the load-lock CVD device is too large if the strength of the pressure resistant case is ensured by means of the wall thickness without using a special pressure resistant shape and pressure resistant structure such as a shape with a curved surface (so-called arch or egg shell shape). This large weight makes transporting it difficult. Moreover, corrosion is also a problem due to the cast iron for structure. When the pressure resistant case of cast iron for structure is plated to prevent corrosion, problems occur such as welding being impossible after the plating process, or the outer dimension of the pressure resistant case does not allow the case to immerse in a plating tank after welding.

Aluminum on the other hand, with its low specific gravity and the same strength as cast iron for structure and stainless steel, possesses approximately half their weight. Therefore, if the thick aluminum plate is used to construct the pressure resistant case, then the weight can be reduced to half that of cast iron for structure and stainless steel. Furthermore, when compared with stainless steel, aluminum has approximately the same cost per weight so material costs can also be reduced by half. A yet additional benefit is that aluminum possesses good machining characteristics so that machining costs can be reduced. In terms of corrosion-resistant characteristics, aluminum also prevents normal atmospheric corrosion because of the tough natural oxidizing film formed on its surface. In other words, using aluminum to construct the pressure resistant case of the load-lock CVD device allows reducing the weight of the pressure resistant case and also lowers the cost.

The TIG welding method is generally often used when constructing a pressure resistant case of plate material. When welding base material pieces together on the outer surface of the pressure resistant case with this TIG welding method, the slit on the adjoining surfaces of the base materials is exposed to the inner side of the pressure resistant case. Gas collects in the slit on the inner side of this pressure resistant case causing a delay in reaching the required pressure at comparatively high vacuum levels, and other unwanted results such as becoming a source of impurities and particles. As welding methods that do not leave a slit on the adjoining surfaces of the base material pieces inside of the pressure resistant case, electron beam welding method and vacuum brazing method are considered.

However, in the electron beam welding method, leak points occur on sections where the beam passed into the inner surface, so that overlapping sections must be formed to eliminate the beam passing. Consequently the problem occurs that the overlapping sections form a slit in the interior of the pressure resistant case.

The vacuum brazing method forms fillets on the internal surface and therefore can avoid occurring of slits on the internal side. However, except for one special type of aluminum, this technology has still not been established for general aluminum.

In the TIG welding method on the other hand, the bead is formed in a shape that blocks the slit on the adjoining surfaces of the base material pieces, and the surface of the bead is formed to comparatively smooth, so that a pressure resistant case providing satisfactory pressure resistance can be constructed by implementing the TIG method on the inner side of the pressure resistant case.

Constructing a pressure resistant case of a load-lock CVD device by TIG welding method using aluminum plate as the base material can provide a pressure resistant case that is excellent in terms of performance, weight, and economy. However, the thermal conductivity of the aluminum (236 W/m·K at 0° C., 240 W/m·K at 100° C.) is about 14 times greater than the thermal conductivity of stainless steel (16.3 W/m·K at 0 to 100° C.). Therefore, the TIG welding method has the problem that vacuum seal welding of material of 20 millimeters or more in plate thickness is extremely difficult. In other words, base material made of aluminum has a large thermal conductivity and therefore localized heating is difficult and the base material sometimes does not melt. TIG welding method can possibly be performed if the material is sufficiently preheated up to approximately 150° C. However, preheating to approximately 150° C. is impossible in view of the adverse effects exerted on the body of the worker in the case of performing TIG welding method on internal sections of the pressure resistant case to prevent the slit on the internal side.

In the present embodiment, the first side plate 63 as the first base material and the ceiling plate 62 as the second base material for performing TIG welding method are formed of aluminum plates of 20 millimeters or more in thickness. However, the upper side of the edge section near the hollow section 72 of the ceiling plate 62 and the locating section 71 of the first side plate 63 for forming the fillet weld section 75 possess a thickness a of approximately 7 millimeters. Therefore, the first side plate 63 as the first base material and the ceiling plate 62 as the second base material can be welded by the TIG welding method without preheating up to approximately 150° C. In other words, by setting the section near the hollow section 72 of the ceiling plate 62 and the locating section 71 of the first side plate 63 for forming the fillet weld section 75 by TIG welding method to a thickness a of approximately 7 millimeters, the heat capacity of the section heated by the heat from the arc during TIG welding is small so that the fillet weld section 75 can be properly formed even if the ceiling plate 62 and the first side plate 63 are made of aluminum plate with 20 millimeters or more thick and possessing a large thermal conductivity.

The above embodiments yield the following effects.

1) The heat capacity of the section heated by the heat from the arc during TIG welding can be suppressed to a small heat capacity by forming the locating section of the second base material and the section facing the hollow section of the first base material for forming the fillet weld section to a thickness of approximately 7 millimeters. Therefore, even the first base material and the second base material made of aluminum plate with a thickness 20 millimeters or more and possessing a large thermal conductivity can be welded by the TIG welding method without preheating to approximately 150° C. or higher.

2) The weight of the pressure resistant case of the load-lock CVD device can be reduced and the cost also lowered, by using aluminum to construct the pressure resistant case.

3) The pressure resistant case of the load-lock CVD device can exert satisfactory resistance to withstand pressure and can also prevent the generation of impurities and particles because by performing the TIG welding method on the inner surface side of the pressure resistant case formed of aluminum plate as the base material, the slit on the adjoining surfaces of the base materials is blocked by the bead formed by TIG welding.

4) The mechanical strength of the pressure resistant case can be increased by setting the thickness of the aluminum plates forming the walls of the pressure resistant case to 20 millimeters or more so that the ability of the pressure resistant case to withstand pressure is sufficiently increased.

5) By using aluminum plate and the TIG welding method to construct the pressure resistant case of the load-lock CVD device, the production cost can be reduced compared to the method for carving the case out from a lump of aluminum or using the aluminum diecast method.

6) By forming a leak check hole to connect the hollow section formed in the base material to the outside, an inspection gas (helium gas) for making leak checks can be filled in the hollow section from the leak check hole so that a leak check inspection of the welded sections can be easily made.

The present invention is not limited to the above embodiments and changes and variations of different types can of course be made without departing from the spirit or the scope of this invention.

Figure 6A:
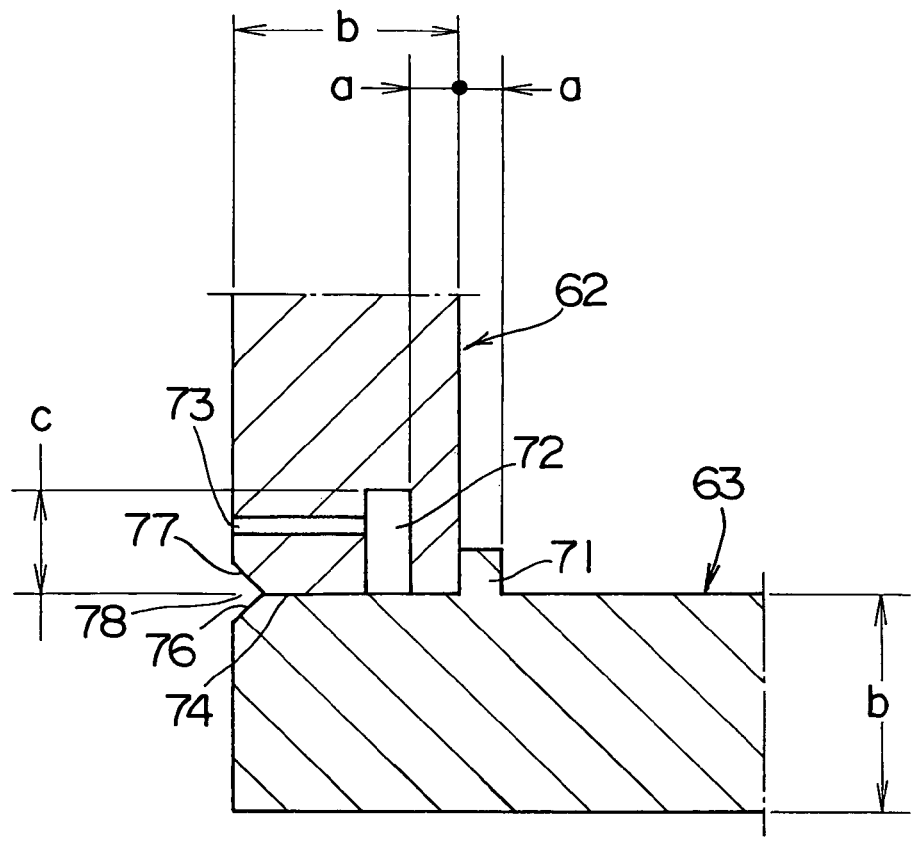
FIGS. 6A and 6B are drawings showing another embodiment of the present invention.
Figure 6B:
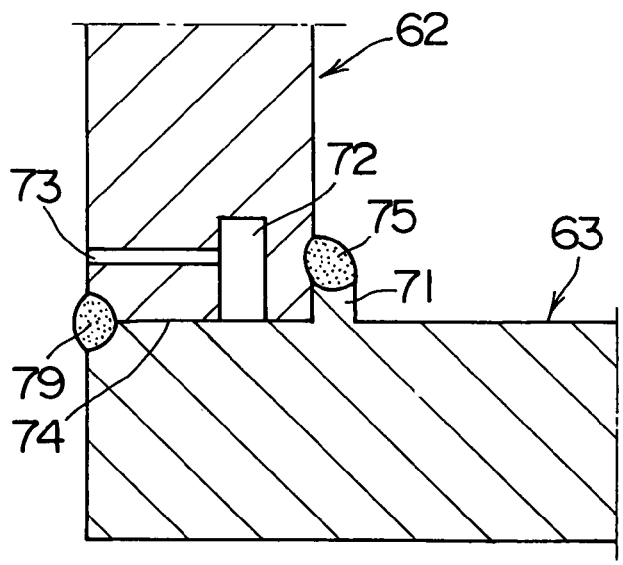

As shown in FIG. 6B for example, a reinforcing weld section 79 may be formed on a weld position on the outer surface side on the section connecting the first base material (first side plate) with the second base material (ceiling plate). In FIG. 6A, C chamfer sections 76, 77 forming a groove 78 are respectively formed on the edge of the main-surface on the side opposite to the side that welds the ceiling plate 62 in the end surface of the first side plate 63, and the edge of the ceiling plate 62 where the first side plate 63 is welded. As shown in FIG. 6A, the reinforcing weld section 79 is formed on the groove 78.

As shown in FIG. 6A, during the welding of the reinforcing weld section 79, the contact section 74 on the side where the hollow section 72 of the ceiling plate 62 is formed, makes contact with the main surface on the side where the locating section 71 of the first side plate 63 is provided, and the edge near the hollow section 72 of the ceiling plate 62 is abutted against the locating section 71. The reinforcing weld section 79 is formed on the outer surface side of the pressure resistant case 22 so that preheating is possible in the welding of the reinforcing weld section 79 and no vacuum seal is required. Therefore, a MIG welding method that forces the deposited metal to shift may also be used. Forming the reinforcing weld section 79 allows increasing the strength resistance to vacuum and makes enlarging the pressure resistant case easier.

As next shown in FIG. 6B, the fillet weld section 75 is formed by TIG welding method at the corner formed by the upper side section of the edge near the hollow section 72 of the ceiling plate 62 and the upper surface of the locating section 71 of the first side plate 63. The ceiling plate 62 and the first side plate 63 are formed by aluminum plate of 20 millimeters thickness or more in the TIG welding, and by forming the thickness a of both the section near the hollow section 72 of the ceiling plate 62 and the locating section 71 of the first side plate 63 for forming the fillet weld section 75 to approximately 7 millimeters, the heat capacity of the section heated by the heat from the arc in the TIG welding method is small so that the suitable fillet weld section 75 can be formed even the ceiling plate 62 and the first side plate 63 made of aluminum with the large thermal conductivity. Along with forming this fillet weld section 75 in a state where the slit on the contact surfaces of the edge of the ceiling plate 62 and the locating section 71 of the first side plate 63 is blocked, the bead surface is formed to be comparatively smooth so that leakage is securely prevented from occurring. In other words, this fillet weld section 75 can maintain the vacuum performance of the pressure resistant case 22 and also functions to reliably prevent impurities and particles from occurring.

By forming the fillet weld section 75 after forming the reinforcing weld section 79, the ceiling plate 62 and the first side plate 63 can be set to a clamped state by the reinforcing weld section 79 so that stable TIG welding in the fillet weld section 75 can be performed.

The locating section and the hollow sections may be structured as shown in FIGS. 7A, 7B, 7C and 7D.

Figure 7A:
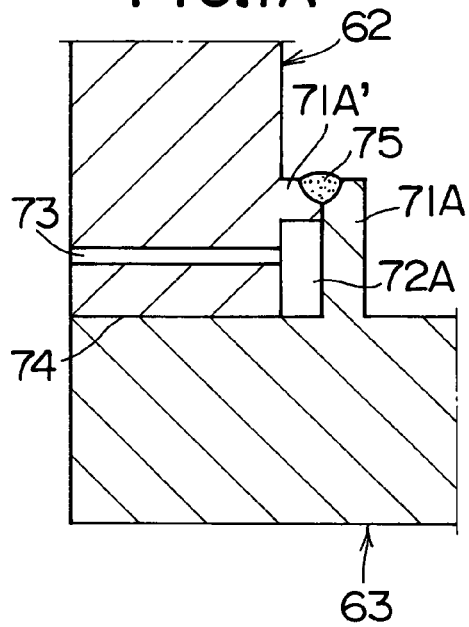
FIGS. 7A to 7D are cross sectional views showing the respective states after welding in other embodiments of the present invention.

In FIG. 7A, the hollow section 72A is formed by a locating section 71a protruding from the first side plate 63 serving as the first base material and thinner than the first side plate 63 and by a locating section 71A' protruding from the ceiling plate 62 serving as the second base material and thinner than the ceiling plate 62.

Figure 7B:
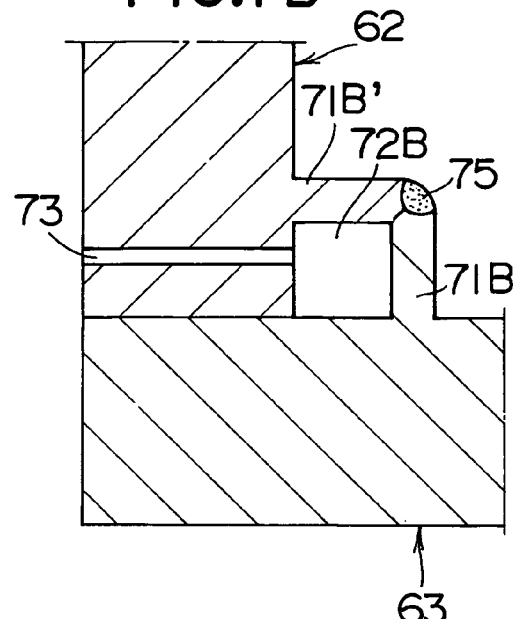

In FIG. 7B, the hollow section 72B is formed with a square shaped cross section by means of a locating section 71B protruding from the first side plate 63 serving as the first base material and thinner than the first side plate 63 and also including a C chamfer section, and a locating section 71B' protruding from the ceiling plate 62 serving as the second base material and thinner than the ceiling plate 62 and also including a C chamfer section.

Figure 7C:
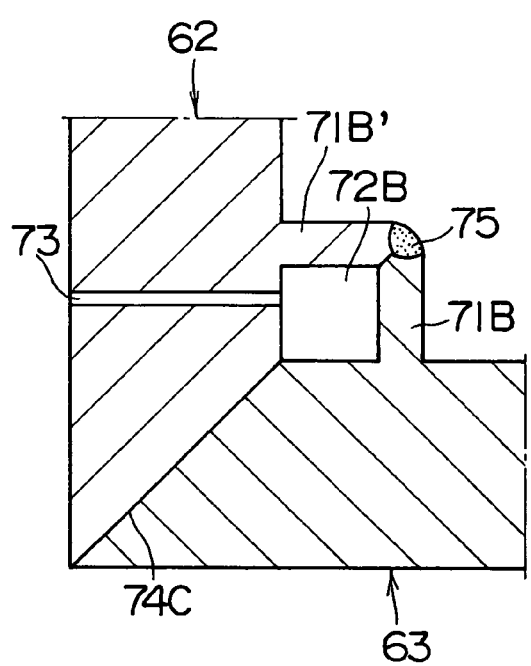

In FIG. 7C, the hollow section 72B is formed with a square shaped cross section by means of a locating section 71B protruding from the first side plate 63 serving as the first base material and including a C chamfer section, and a locating section 71B' protruding from the ceiling plate 62 serving as the second base material and including a C chamfer section. The first side plate 63 as the first base material and the ceiling plate 62 as the second base material are in contact by way of a C chamfered contact section 74C.

Figure 7D:
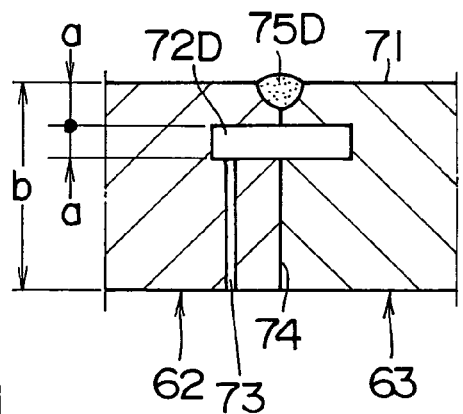

In FIG. 7D, the hollow section 72D is formed by narrow grooves thinner than the first base material and the second base material and respectively formed in end surfaces joined with the mutual end surfaces of the first base material and the second base material. A butt weld section 75D is formed on the main surfaces at a position on the hollow section 72D side on the main surfaces of the first base material and second base material.

The first base material and the second base material are not limited to being formed from aluminum and may be formed from other metals. When formed in particular by using a metal with a thermal conductivity of 40 W/m·K or more, such as copper with thermal conductivity of 403 W/m·K at 0° C., 395 W/m·K at 100° C., the superior effect of this invention can be obtained.

A load-lock CVD device was described in the above embodiments, however, this invention can also be applied to general substrate processing devices including a container.

The method for manufacturing ICs in the above embodiments described a film forming process for forming CVD film on a wafer. However, the present invention can also be applied to overall processes of all types for manufacturing semiconductor devices such as thermal treatment processes including oxidizing process and diffusion processes, reflow processes, and annealing processes.

In the description in the above embodiments, a container was used in the pressure resistant case of the load-lock CVD device. However, the present invention can also be applied to other general containers such as for high pressure tanks and vacuum containers.

The invention as described above allows constructing a container of material with high thermal conductivity such as aluminum by welding so that the performance of the container can be maintained while at the same time providing a lighter weight and more economical container.

The invention claimed is:

1. A substrate processing device comprising a container which includes a joining section between a first base material and a second base material,
   wherein a weld section welding the first base material to the second base material, a hollow section, and a contact section are arranged along the width of the second base material in sequence in the joining section between the first base material and the second base material,
   wherein the thickness of the weld section is set thinner than the thickness of the contact section, and wherein the weld section is formed on an inner side of the container and the contact section is positioned on an outer side section of the container.

2. A substrate processing device according to claim 1, wherein the contact section further includes a weld.

3. A substrate processing device according to claim 1, wherein the weld section welds a locating section formed on the main surface of the first base material to the second base material.

4. A substrate processing device according to claim 1, wherein a temporary fastening is provided between the first base material and the second base material.

5. A substrate processing device according to claim 1, wherein the weld section comprises an edge portion of the second base material and a weld securing the first base material to the second base material.

6. A substrate processing device comprising:

a processing chamber for processing a substrate; and a container for forming a standby chamber adjoining the processing chamber, and including a joining section between a first base material and a second base material, wherein a weld section welding the first base material to the second base material, a hollow section, and a contact section are arranged along the width of the second base material in sequence in the joining section between the first base material and the second base material, wherein the thickness of the weld section is set thinner than the thickness of the contact section, and wherein the weld section is formed on an inner side of the container and the contact section is positioned on an outer side section of the container.

7. A substrate processing device according to claim 6, wherein the contact section further includes a weld.

8. A substrate processing device according to claim 6, wherein a path is formed connecting from the hollow section to the surface of the second base material opposite the weld section.

9. A substrate processing device according to claim 6, wherein the weld section welds a locating section formed on the main surface of the first base material to the second base material.

10. A substrate processing device according to claim 6, wherein a temporary fastening is provided between the first base material and the second base material.

11. A substrate processing device according to claim 6, wherein the weld section comprises an edge portion of the second base material and a weld securing the first base material to the second base material.

* * * * *